(12) United States Patent
Ryu

(10) Patent No.: US 11,522,493 B1
(45) Date of Patent: Dec. 6, 2022

(54) REFLECTOR FOR BIFACIAL SOLAR MODULE AND BIFACIAL PHOTOVOLTAIC SYSTEM INCLUDING THE SAME

(71) Applicant: Jinsung e&c, Cheongju-si (KR)

(72) Inventor: Yungyun Ryu, Cheongju-si (KR)

(73) Assignee: Jinsung e&c, Cheongju-si (KR)

( * ) Notice: Subject to any disclaimer, the term of this patent is extended or adjusted under 35 U.S.C. 154(b) by 0 days.

(21) Appl. No.: 17/510,433

(22) Filed: Oct. 26, 2021

(30) Foreign Application Priority Data

Oct. 22, 2021 (KR) .................. 10-2021-0141712

(51) Int. Cl.
| | | |
|---|---|---|
| H02S 40/22 | (2014.01) | |
| H02S 20/30 | (2014.01) | |
| H02S 20/10 | (2014.01) | |
| H02S 20/32 | (2014.01) | |
| H01L 31/054 | (2014.01) | |
| H01L 31/0232 | (2014.01) | |

(52) U.S. Cl.
CPC ........ *H02S 40/22* (2014.12); *H01L 31/02327* (2013.01); *H01L 31/054* (2014.12); *H02S 20/10* (2014.12); *H02S 20/30* (2014.12); *H02S 20/32* (2014.12)

(58) Field of Classification Search
CPC ................. H02S 40/22; H02S 20/32
See application file for complete search history.

(56) References Cited

FOREIGN PATENT DOCUMENTS

| KR | 10-2019-0070125 A | 6/2019 |
| KR | 10-2149746 B1 | 8/2020 |
| KR | 10-2021-0058317 A | 5/2021 |

*Primary Examiner* — Bethany L Martin
(74) *Attorney, Agent, or Firm* — Revolution IP, PLLC

(57) ABSTRACT

Disclosed are a reflector for a bifacial solar module and a bifacial photovoltaic system including the same, wherein the reflector includes a reflecting panel configured to reflect sunrays toward back surfaces of a first bifacial solar module and a second bifacial solar module which are located higher than the ground, a mobile cart configured to support the reflecting panel and be movable below and between the first bifacial solar module and the second bifacial solar module, and a control portion configured to control a position of the mobile cart to maximize power generation amounts of the first bifacial solar module and the second bifacial solar module.

15 Claims, 6 Drawing Sheets

REFLECTOR FOR BIFACIAL SOLAR MODULE AND BIFACIAL PHOTOVOLTAIC SYSTEM INCLUDING THE SAME

CROSS-REFERENCE TO RELATED APPLICATION

This application claims priority to and the benefit of Korean Patent Application No. 10-2021-0141712 filed on Oct. 22, 2021, the disclosure of which is incorporated herein by reference in its entirety.

BACKGROUND

1. Field of the Invention

The present invention relates to a reflector for a bifacial solar module and a bifacial photovoltaic system and, more particularly, to a reflector for a bifacial solar module configured to produce electricity using light energy from the sun and a bifacial photovoltaic system including the same.

2. Discussion of Related Art

A bifacial light-receiving solar module generates power by not only absorbing direct light at a front surface but also absorbing light at a back surface due to light reflection of a reflecting panel installed on a bottom surface or a side surface.

To this end, in a cell unit, instead of existing back surface field (BSF) back electrodes, a grid type back surface electrode configured to transmit light is required. Also, while manufacturing a module, a transparent back sheet or a glass back cover is applied instead of an oblique back sheet.

An amount of light coming into a back surface is greatly influenced by albedo determined according to a type and properties of the reflecting panel. When a bifacial module is used, it is possible to expect an additional generation quantity according to the albedo of the reflecting panel. Generally, in an existing constructed bifacial light-receiving solar module, a reflecting panel utilizing a rolled aluminum plate is installed on an entirety of a lower end of the solar module or a small reflector is fixed to a lower end while a structure is constructed so that reflection efficiency increases.

Related thereto, Korean Patent Registration No. 2149746 (hereinafter, referred to as Related Art Document) discloses a generation device using an outdoor bifacial solar module. The generation device using the outdoor bifacial solar module in the related art document includes a photovoltaic device and a solar reflector.

Such photovoltaic devices are installed to be tilted in a direction toward sunlight and fixed at certain intervals. The photovoltaic device includes a bifacial module. The bifacial module is installed to adjust a tilt angle using an angle adjustment fixing device according to an elevation angle of the sun for each season.

The solar reflector is installed between adjacent photovoltaic devices. The solar reflector is configured to reflect sunlight toward a back surface of a bifacial module at an angle of reflection through a reflective mirror formed of a convex mirror so as to allow the bifacial module to generate power.

However, the generation device using the bifacial solar module in the Related Art Document has a disadvantage that adjustment of an angle of the reflective mirror according to variations in the elevation angle of the sun for each season depends on manipulation of an administrator. Accordingly, since the elevation angle of the sun varies everyday, a method of responding to the variations in the elevation angle of the sun actively is required.

The sunlight includes not only direct light transferred to an object directly without reflection or scattering but also scattered light in a direction changed by scattering due to clouds, fine dust, other objects, and the like. An amount and an incident angle of scattered light may vary according to environmental factors such as clouds, fine dust, other objects, and the like.

However, the reflective mirror of the generation device using the bifacial solar module in the related art document has a limitation in that the reflective surface forms a uniform reflective surface such that only direct light is reflected toward the back surface of the bifacial module but reflection efficiency of scattered light is insignificant.

Accordingly, the generation device using the bifacial solar module in the related art document has a limitation in improvement of power generation performance through bifacial light reception due to an excessive difference of reflexibility toward the back surface of the bifacial module which is caused by environmental factors. Accordingly, a method of significantly improving reflection efficiency toward the back surface of the bifacial module is required.

RELATED ART DOCUMENT

[Patent Document]
Korean Patent Registration No. 2149746 (registered on Aug. 25, 2020)

SUMMARY OF THE INVENTION

The present invention is directed to providing a reflector for a bifacial solar module configured so that a position and an angle of a reflective surface are automatically adjusted according to variations of an elevation angle of the sun and not only direct light but also scattered light are reflected toward back surfaces of the bifacial solar module so as to maximize power generation performance of the bifacial solar module, and the photovoltaic system including the same.

According to an aspect of the present invention, there is provided a reflector for a bifacial solar module. The reflector includes a reflecting panel configured to reflect sunrays toward back surfaces of a first bifacial solar module and a second bifacial solar module which are located higher than the ground, a mobile cart configured to support the reflecting panel and be movable below and between the first bifacial solar module and the second bifacial solar module, and a control portion configured to control a position of the mobile cart to maximize power generation amounts of the first bifacial solar module and the second bifacial solar module.

A position value of the mobile cart according to an elevation angle of the sun may be set in the control portion, and the control portion may control a position of the mobile cart according to the elevation angle of the sun.

The control portion may receive real-time power generation amounts of the first bifacial solar module and the second bifacial solar module. Also, the control portion may control a position of the mobile cart to be a position where the power generation amounts of the first bifacial solar module and the second bifacial solar module are maximized.

Rails, along which wheels of the mobile cart roll, may be provided lengthwise in a direction in which the first bifacial solar module and the second bifacial solar module are spaced apart from each other.

Rails, along which wheels of the mobile cart roll, may be provided lengthwise in a direction perpendicular to a direction in which the first bifacial solar module and the second bifacial solar module are spaced apart from each other.

The mobile cart may include a controller configured to receive a signal from the control portion and a driving portion configured to rotate the wheels according to a signal of the controller.

The driving portion may include a motor rotatable bidirectionally according to the signal of the controller. Torque of the motor may be transmitted to a rotating shaft of the wheels through gear drive, chain drive, or belt transmission.

The mobile cart may include a controller configured to receive a signal from the control portion and a driving portion configured to rotate the wheels according to a signal of the controller.

The driving portion may include a motor rotatable bidirectionally according to the signal of the controller. Torque of the motor may be transmitted to a rotating shaft of the wheels through gear drive, chain drive, or belt transmission.

The reflecting panel may include a first reflection portion configured to reflect sunrays toward the first bifacial solar module and a second reflection portion configured to reflect sunrays toward the second bifacial solar module. Also, a reflective surface of the first reflection portion and a reflective surface of the second reflection portion may be plane-symmetrical to each other.

The reflective surface of the first reflection portion and the reflective surface of the second reflection portion may form a curved surface.

The first reflection portion may include a 1-1 reflection portion configured to form a reflective surface facing the sky and a 1-2 reflection portion configured to form a reflective surface forming an obtuse angle with the reflective surface of the 1-1 reflection portion.

The second reflection portion may include a 2-1 reflection portion configured to form a reflective surface facing the sky and configured to be plane-symmetrical to the 1-1 reflection portion and a 2-2 reflection portion configured to form a reflective surface forming an obtuse angle with the reflective surface of the 2-1 reflection portion and configured to be plane-symmetrical to the 1-2 reflection portion. Also, the reflective surface of the 1-2 reflection portion and the reflective surface of the 2-2 reflection portion may form a reflex angle.

The reflecting panel may be rotatably coupled to the mobile cart. Also, the mobile cart includes a controller configured to receive a signal from the control portion and an angle adjustment module configured to rotate the reflecting panel according to a signal of the control portion.

The angle adjustment module may include a motor rotatable bidirectionally according to the signal of the controller. Torque of the motor may be transmitted to a rotating shaft of the reflecting panel through gear drive, chain drive, or belt transmission.

According to another aspect of the present invention, there is provided a bifacial photovoltaic system including a first bifacial solar module spaced apart from the ground and having a front surface facing the sky, a second bifacial solar module spaced apart from the ground and having a front surface facing the sky, a reflecting panel configured to reflect sunrays toward back surfaces of the first bifacial solar module and the second bifacial solar module, a mobile cart configured to support the reflecting panel and be movable below and between the first bifacial solar module and the second bifacial solar module, and a control portion configured to control a position of the mobile cart to maximize power generation amounts of the first bifacial solar module and the second bifacial solar module.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, exemplary embodiments of the present invention will be described in detail with reference to the attached drawings as follows. However, in describing the present invention, a description of already well-known functions or components will be omitted in order to clarify the essentials of the present invention.

A reflector 10 of a bifacial solar module and a bifacial photovoltaic system 1000 including the same according to the present invention are configured so that a position and an angle of a reflective surface are adjusted automatically according to variations in the elevation angle of the sun and not only direct light but also scattered light are reflected to back surfaces of solar modules 1 and 2 so as to maximize power generation performance of the solar modules 1 and 2.

Figure 1:
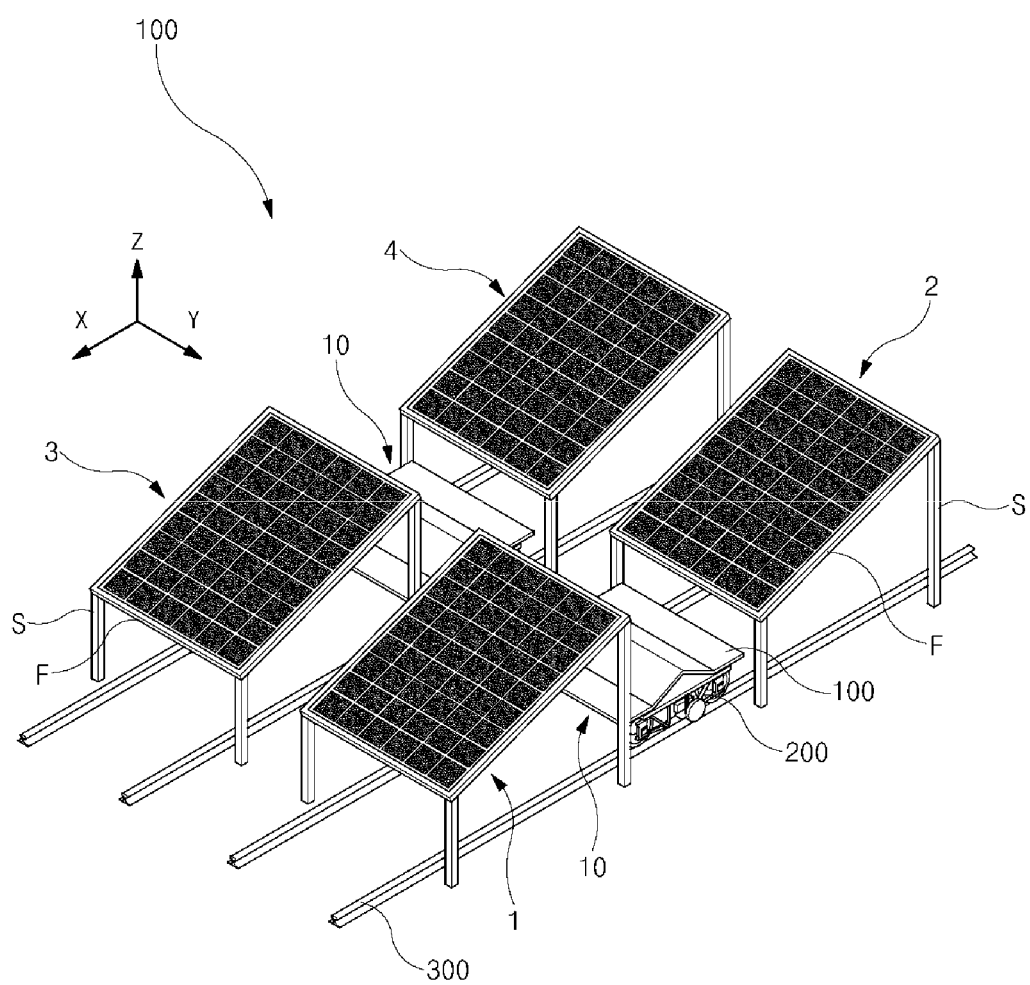
FIG. 1 is a perspective view of a bifacial photovoltaic system according to one embodiment of the present invention.
Figure 2:
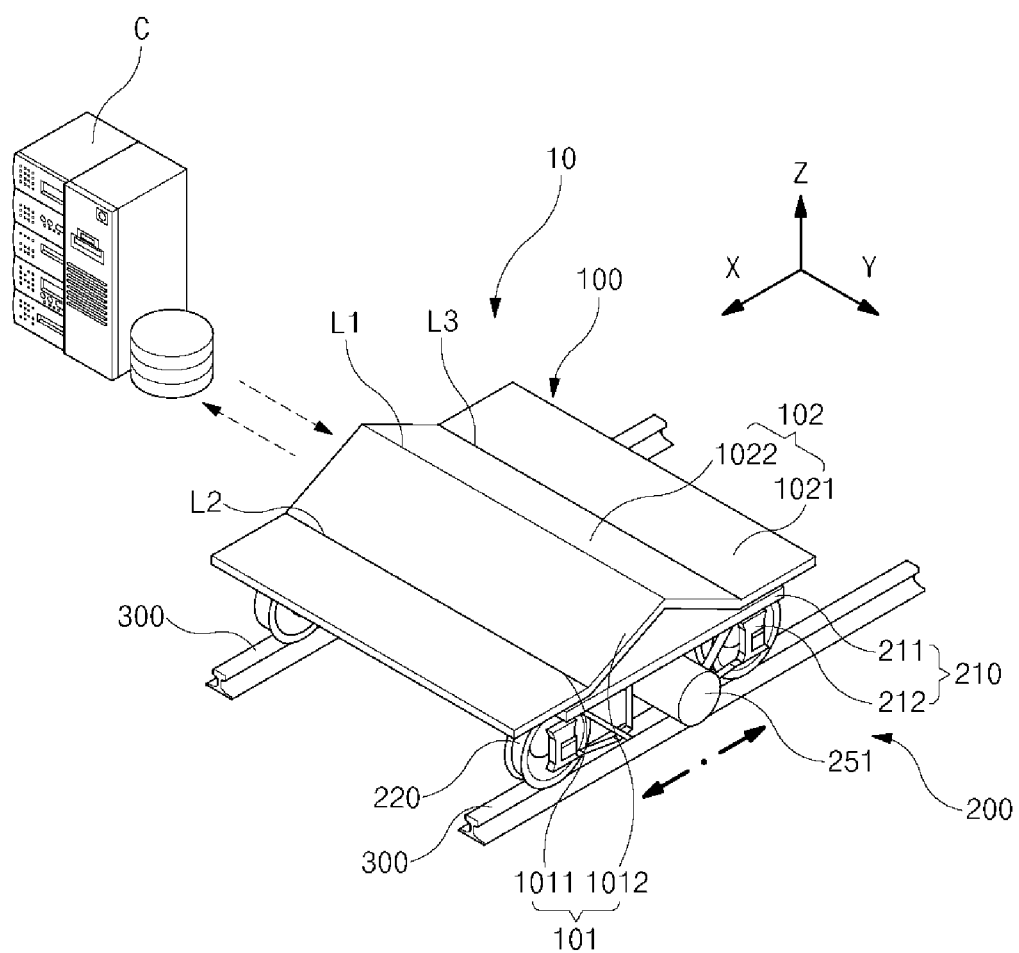
FIG. 2 is a perspective view illustrating a reflector of a bifacial solar module of FIG. 1.
Figure 3:
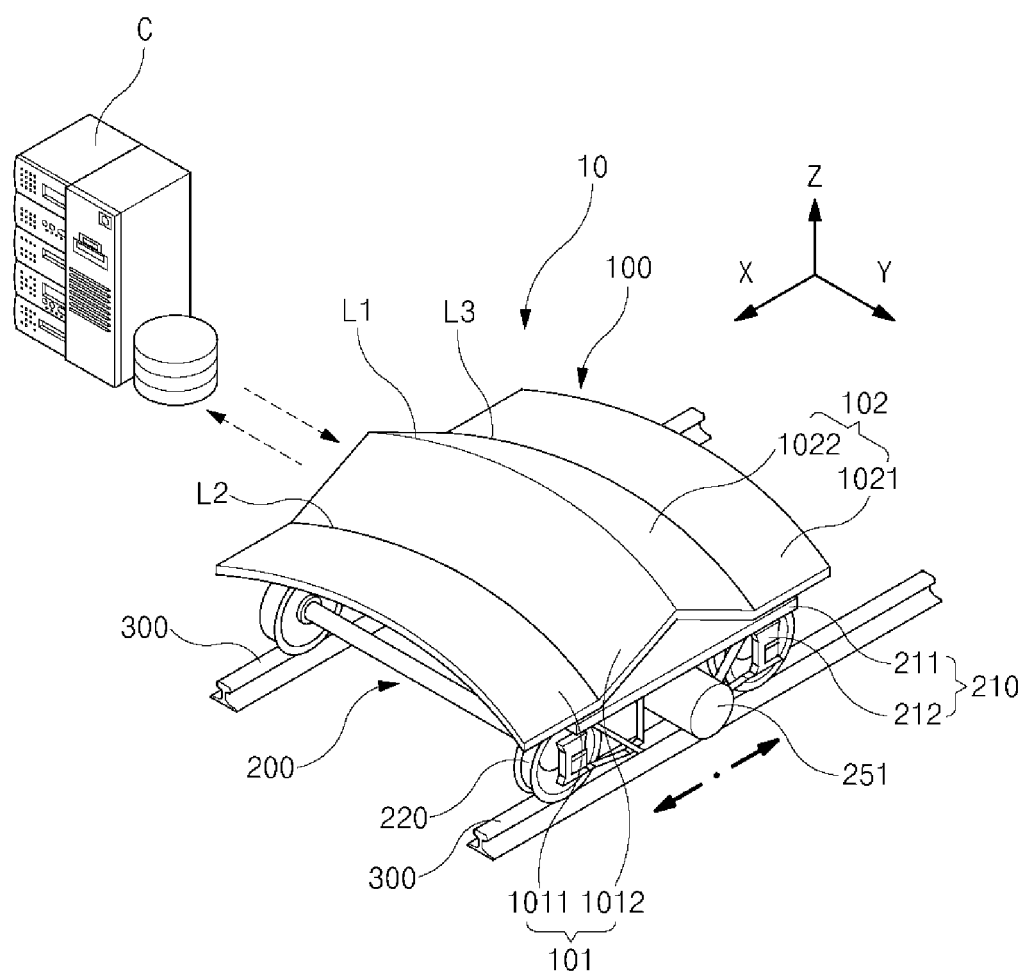
FIG. 3 is a perspective view illustrating a reflector of a bifacial photovoltaic system according to another embodiment of the present invention.

FIG. 1 is a perspective view of the bifacial photovoltaic system 1000 according to one embodiment of the present invention. FIG. 2 is a perspective view illustrating the reflector 10 for the bifacial solar module of FIG. 1. FIG. 3 is a perspective view of the reflector 10 for the bifacial photovoltaic system 1000 according to another embodiment of the present invention.

To allow the present invention to be easily understood, three-dimensional rectangular coordinate systems are illustrated in the drawings. The three-dimensional rectangular coordinate system includes an X-axis, a Y-axis, and a Z-axis. The X-axis direction may mean the south. The Y-axis direction may mean the east. The Z-axis may mean the upper side.

As shown in FIGS. 1 and 2, the bifacial photovoltaic system 1000 according to one embodiment of the present invention is configured to produce electricity using light energy from the sun and includes a first bifacial solar module 1, a second bifacial solar module 2, and the reflector 10.

The first bifacial solar module 1 is a device configured to generate power by converting sunlight into direct current (DC) electricity. The first bifacial solar module 1 forms a shape by connecting and coupling solar cells longitudinally and laterally. The first bifacial solar module 1 has a rectangular shape. Electricity produced by each solar cell is collected at a module at the same time.

The first bifacial solar module 1 has a front surface facing the sky. The first bifacial solar module 1 includes a bifacial light-receiving solar module configured to generate power by absorbing light through not only the front surface but also a back surface.

The bifacial light-receiving solar module generates power by absorbing from both of the front surface and the back surface. That is, while simultaneously producing electricity using sunlight incident onto the front surface like a general monohedral light-receiving solar module, sunlight reflected by the surface of the earth, artificial reflective surfaces, and peripheral objects is received by the back surface of the module and converted into electricity.

The bifacial light-receiving solar module has been reported as improving power generation performance by 50% or more in comparison to a monohedral light-receiving solar module through albedo variations of artificial reflective surfaces.

The bifacial light-receiving module has been reported as receiving a lot of influence from peripheral environments such as an installation height and angle of the module, a distance between the modules, conditions of the reflective surface such as coarseness, reflexibility, and the like. The bifacial photovoltaic system 1000 according to one embodiment of the present invention relates to improvement in reflexibility of the artificial reflective surface.

The electricity produced by the first bifacial solar module 1 may be transferred to an electrical power system via a connection board, an inverter, a distributing board, and the like. Otherwise, the electricity produced by the first bifacial solar module 1 may be stored in a battery band B through a charge controller, the inverter, and the like.

A control portion C may be connected to the inverter wirelessly or through wires so as to monitor operating conditions (energy output) of the bifacial photovoltaic system 1000 in real time.

Since the bifacial light-receiving solar module is a well-know technique as disclosed in Korean Patent Registration No. 2149746, a more detailed description will be omitted.

As shown in FIG. 1, a frame F is provided on an edge of the first bifacial solar module 1. The frame F forms a framework shape. The frame F may be formed of a metal pipe.

A support S supports the frame F from the ground. Two or more supports S may be provided. The first bifacial solar module 1 is located higher than the ground due to the support S. FIG. 1 illustrates that four supports S are provided.

Maximum power generation efficiency is shown when surfaces of the solar modules 1 and 2 are at a right angle with sunrays. The sun moves at a relatively high altitude in summer and moves at a relatively low altitude in winter. Accordingly, angles of the solar modules 1 and 2 may be adjusted seasonally. Here, the support S may include a length-adjustable structure.

The second bifacial solar module 2 is a device configured to generate power by converting sunlight into DC electricity. The second bifacial solar module 2 forms a shape by connecting and coupling solar cells longitudinally and laterally. The second bifacial solar module 2 has a rectangular shape. Electricity produced by each solar cell is collected at the module at the same time.

The second bifacial solar module 2 has a front surface facing the sky. The second bifacial solar module 2 includes a bifacial light-receiving solar module configured to generate power by absorbing light through not only the front surface but also a back surface.

The electricity produced by the second bifacial solar module 2 may be transferred to an electrical power system via a connection board, an inverter, a distributing board, and the like. Otherwise, the electricity produced by the second bifacial solar module 2 may be stored in a battery band B through a charge controller, the inverter, and the like. A control portion C may be connected to the inverter wirelessly or through wires so as to monitor operating conditions of the bifacial photovoltaic system 1000.

The bifacial photovoltaic system 1000 according to one embodiment of the present invention may employ Internet of Things (IoT) technology. The IoT refers to a network technology in which humans, things, processes, and the like are connected over the Internet so that information is generated, collected, shared, and utilized.

As an example, the control portion C may be connected to the Internet and receive weather information. Operating information of the bifacial photovoltaic system 1000 according to the weather information may be set in the control portion C. The control portion C may automatically control the bifacial photovoltaic system 1000 according to the weather information. As an example, when a sunshine amount is less than a reference amount, the control portion C may stop an operation of the reflector 10.

The control portion C may transmit and receive data with a device such as an administrator's smart phone or the like. As an example, an administrator may see a variety of data of the bifacial photovoltaic system 1000 such as a real-time power generation amount and position information of a mobile cart through an output window of an application installed in his or her smart phone. Also, the administrator may manually control the reflector 10 through an input window of the application.

As shown in FIG. 1, a frame F is provided on an edge of the second bifacial solar module 2. The frame F forms a framework shape. The frame F may be formed of a metal pipe. A support S supports the frame F from the ground. Two or more supports S may be provided. The second bifacial solar module 2 is located higher than the ground due to the support S. FIG. 1 illustrates that four supports S are provided.

Maximum power generation efficiency is shown when surfaces of the solar modules 1 and 2 are at a right angle with sunrays. The sun moves at a relatively high altitude in summer and moves at a relatively low altitude in winter. Accordingly, angles of the solar modules 1 and 2 may be adjusted seasonally. Here, the support S may include a length-adjustable structure.

The first bifacial solar module 1 and the second bifacial solar module 2 have substantially the same structure. The first bifacial solar module 1 and the second bifacial solar module 2 should be understood as being distinguished according to installation positions of the bifacial solar modules 1 and 2. The first bifacial solar module 1 and the second bifacial solar module 2 are spaced apart from each other in a longitudinal direction of the X-axis.

As shown in FIG. 1, the bifacial solar modules 1 and 2 may be provided in the east and west on the basis of the first bifacial solar module 1, respectively. In FIG. 1, it is shown that a bifacial solar module (hereinafter, referred to as a third bifacial solar module 3) is provided in the west on the basis of the first bifacial solar module 1.

Figure 4:
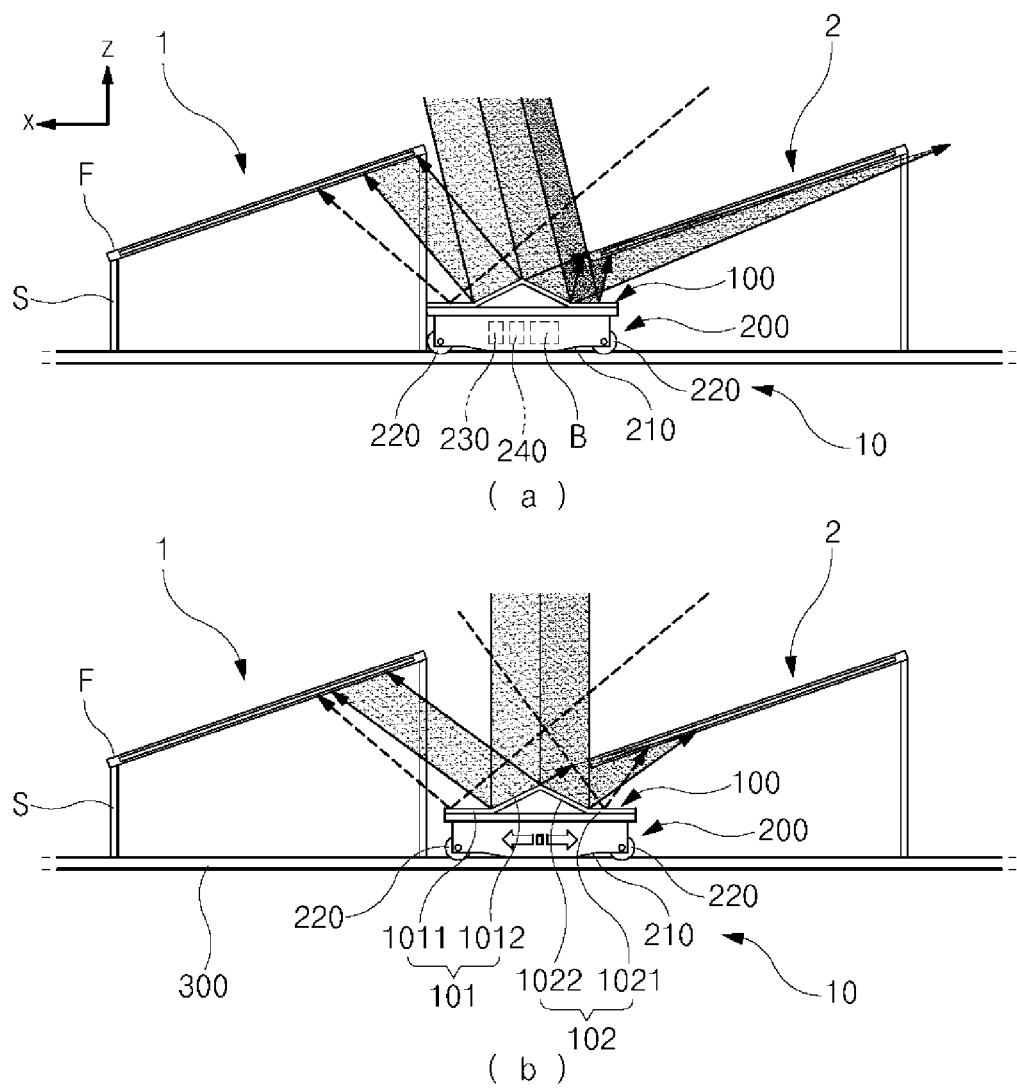
FIG. 4 shows side views (A)-(B) illustrating a state of using the bifacial photovoltaic system of FIG. 1.

The bifacial solar modules 1 and 2 may be provided in the east and west on the basis of the second bifacial solar module 1, respectively. In FIG. 1, it is shown that a bifacial solar module (hereinafter, referred to as a fourth bifacial solar module 4) is provided in the west on the basis of the second bifacial solar module 2. FIGS. 4A and 4B are side views illustrating a state of using the bifacial photovoltaic system 1000 of FIG. 1. A solid line arrow in FIG. 4 means direct light of sunrays. A dotted line in FIG. 4 arrow means scattered light of sunrays.

As shown in FIGS. 4A and 4B, a reflecting panel 100 is a component configured to reflect sunrays toward back surfaces of the first bifacial solar module 1 and the second bifacial solar module 2. The reflecting panel 100 forms an overall bent panel shape. The reflecting panel 100 is manufactured using a material reflecting sunrays. As an example, the reflecting panel 100 may be manufactured using a rolled aluminum panel.

As shown in FIGS. 2, 4A, and 4B, the reflecting panel 100 includes a first reflection portion 101 and a second reflection portion 102. The first reflection portion 101 is a portion reflecting sunrays toward the first bifacial solar module 1. The second reflection portion 102 is a portion reflecting sunrays toward the second bifacial solar module 2. The first reflection portion 101 and the second reflection portion 102 may be divided by a boundary line in a direction of the Y-axis (hereinafter, referred to as a first boundary line L1).

The first reflection portion 101 and the second reflection portion 102 form reflective surfaces. An angle between the reflective surface of the first reflection portion 101 and the reflective surface of the second reflection portion 102 is a reflex angle greater than 180 degrees. The reflective surface of the first reflection portion 101 and the reflective surface of the second reflection portion 102 may be plane-symmetrical to each other on the basis of a virtual surface including the first boundary line L1.

The first reflection portion 101 includes a 1-1 reflection portion 1011 and a 1-2 reflection portion 1012. The 1-1 reflection portion 1011 and the 1-2 reflection portion 1012 may be divided by a boundary line in a direction of the Y-axis (hereinafter, referred to as a second boundary line L2). The first boundary line L1 and the second boundary line L2 may be parallel to each other. The first boundary line L1 is located at a position higher than the second boundary line L2.

The 1-1 reflection portion 1011 forms a reflective surface facing the sky. As an example, the reflective surface of the 1-1 reflection portion 1011 may be perpendicular to a gravitational direction. The 1-1 reflection portion 1011 forms a reflective surface configured to reflect direct light and scattered light of sunrays toward the back surface of the first bifacial solar module 1.

The 1-2 reflection portion 1012 is provided between the 1-1 reflection portion 1011 and the second reflection portion 102. The 1-2 reflection portion 1012 forms a reflective surface at an obtuse angle with the reflective surface of the 1-1 reflection portion 1011. The 1-2 reflection portion 1012 forms the reflective surface configured to reflect direct light and scattered light of sunrays toward the back surface of the first bifacial solar module 1. The reflective surfaces of the 1-1 reflection portion 1011 and the 1-2 reflection portion 1012 reflect sunrays at different angles.

The second reflection portion 102 includes a 2-1 reflection portion 1021 and a 2-2 reflection portion 1022. The 2-1 reflection portion 1021 and the 2-2 reflection portion 1022 may be divided by a boundary line in a direction of the Y-axis (hereinafter, referred to as a third boundary line L3). The first boundary line L1 and the third boundary line L3 may be parallel to each other. The first boundary line L1 is located at a position higher than the third boundary line L3.

The 2-1 reflection portion 1021 forms a reflective surface facing the sky. As an example, the reflective surface of the 2-1 reflection portion 1021 may be perpendicular to a gravitational direction.

The 2-1 reflection portion 1021 forms the reflective surface configured to reflect direct light and scattered light of sunrays toward the back surface of the second bifacial solar module 2. The reflective surface of the 1-1 reflection portion 1011 and the reflective surface of the 2-1 reflection portion 1021 may be plane-symmetrical to each other on the basis of a virtual surface including the first boundary line L1.

The 2-2 reflection portion 1022 is provided between the 2-1 reflection portion 1021 and the first reflection portion 101. The 2-2 reflection portion 1022 forms a reflective surface at an obtuse angle with the reflective surface of the 2-1 reflection portion 1021. The 2-2 reflection portion 1022 forms the reflective surface configured to reflect direct light and scattered light of sunrays toward the back surface of the second bifacial solar module 2. The reflective surfaces of the 2-1 reflection portion 1021 and the 2-2 reflection portion 1022 reflect sunrays at different angles.

An angle between the reflective surface of the 1-2 reflection portion 1012 and the reflective surface of the 2-2 reflection portion 1022 is a reflex angle greater than 180 degrees. The reflective surface of the 1-2 reflection portion 1012 and the reflective surface of the 2-2 reflection portion 1022 may be plane-symmetrical to each other on the basis of a virtual surface including the first boundary line L1.

As shown in FIG. 3, the reflective surface of the first reflection portion 101 and the reflective surface of the second reflection portion 102 may form a curved surface. As an example, the reflective surface of the first reflection portion 101 and the reflective surface of the second reflection portion 102 may form a curved surface including one or more curvature radiuses on the basis of a virtual line in a longitudinal direction of the X-axis.

As an example, the reflective surface of the first reflection portion 101 and the reflective surface of the second reflection portion 102 may form a convex surface which is convex upward. Accordingly, direct light and scattered light reflected by the reflective surface of the first reflection portion 101 may spread in a longitudinal direction of the Y-axis and be incident onto not only the back surface of the first bifacial solar module 1 but also the back surface of the third bifacial solar module 3.

Also, direct light and scattered light reflected by the reflective surface of the second reflection portion 102 may spread in the longitudinal direction of the Y-axis and be incident onto not only the back surface of the second bifacial solar module 2 but also the back surface of the fourth bifacial solar module 4.

As shown in FIGS. 1 and 2, the mobile cart 200 supports the reflecting panel 100. The mobile cart 200 is movably provided below and between the first bifacial solar module 1 and the second bifacial solar module 2. The mobile cart 200 includes a body 210, wheels 220, a driving portion 250, a controller 230, and a communication portion 240.

The body 210 includes an upper panel 211 and a pair of side panels 212. The reflecting panel 100 is mounted on an upper surface of the upper panel 211. The reflecting panel 100 may be coupled to the upper panel 211 through a bolt, welding, or the like. The pair of side panels 212 is coupled to a bottom of the upper panel 211.

The wheels 220 include a pair of front wheels 221 and a pair of rear wheels 222. Axles of the front wheels 221 and the rear wheels 222 are rotatably coupled to the pair of side panels 212.

As shown in FIG. 1, rails 300 are provided below the first bifacial solar module 1 and the second bifacial solar module 2. The rails 300 may be fixed to the ground.

The rails 300 are formed lengthwise in a direction in which the first bifacial solar module 1 and the second bifacial solar module 2 are spaced apart from each other, that is, in the longitudinal direction of the X-axis. The rails 300 are configured to pass below the first bifacial solar module 1 and the second bifacial solar module 2. The front wheels 221 and the rear wheels 222 of the mobile cart 200 are mounted on the rails 300.

The driving portion 250 is a component configured to transmit torque to the wheels 220. The driving portion 250 rotates or stops the wheels 220 according to a signal of the controller 230. The driving portion 250 includes a motor 251 and a torque transmission unit 252.

The motor 251 rotates bidirectionally due to a signal of the controller 230. The driving portion 250 further includes the battery B configured to supply power to the motor 251. The torque transmission unit 252 is a component configured to transmit the torque of the motor 251 to the axle of front wheels 221 or the rear wheels 222. The torque transmission unit 252 may implement gear drive, chain drive, or belt transmission.

As an example, the torque transmission unit 252 may implement belt transmission including a pulley and a belt. Since a gear drive, chain drive, or belt transmission is a well known technology, a detailed description thereof will be omitted.

When the torque of the driving portion 250 is applied to the axle of the front wheels 221 or the rear wheels 222, the mobile cart 200 moves along the rails 300.

FIG. 4A illustrates a state in which the elevation angle of the sun is relatively low (hereinafter, referred to as a first state). As an example, FIG. 4A may seasonally mean winter. FIG. 4B illustrates a state in which the elevation angle of the sun is relatively high (hereinafter, referred to as a second state). As an example, FIG. 4B may seasonally mean summer. A solid line arrow in FIG. 4 means direct light of sunrays. A dotted line arrow in FIG. 4 means scattered light of sunrays.

As described above, the first reflection portion 101 is a part reflecting sunrays toward the first bifacial solar module 1. As shown in FIG. 4A, the 1-2 reflection portion 1012 generally reflects direct light of sunrays toward the back surface of the first bifacial solar module 1. The 1-1 reflection portion 1011 generally reflects scattered light of sunrays toward the back surface of the first bifacial solar module 1.

As described above, the second reflection portion 102 is a part reflecting sunrays toward the second bifacial solar module 2. As shown in FIG. 4B, the 2-2 reflection portion 1022 generally reflects direct light of sunrays toward the back surface of the second bifacial solar module 2. The 2-1 reflection portion 1021 generally reflects scattered light of sunrays toward the back surface of the second bifacial solar module 2.

As shown in FIGS. 4A and 4B, the control portion C may control a position of the mobile cart 200 according to the elevation angle of the sun so as to maximize power generation amounts of the first bifacial solar module 1 and the second bifacial solar module 2. The control portion C may prestore position values of the mobile cart 200 at which the power generation amounts of the first bifacial solar module 1 and the second bifacial solar module 2 are maximized according to the elevation angle of the sun.

FIG. 4A illustrates a position of the mobile cart 200 at which the power generation amounts of the first bifacial solar module 1 and the second bifacial solar module 2 are maximized in the first state. FIG. 4B illustrates a position of the mobile cart 200 at which the power generation amounts of the first bifacial solar module 1 and the second bifacial solar module 2 are maximized in the second state.

Figure 5:
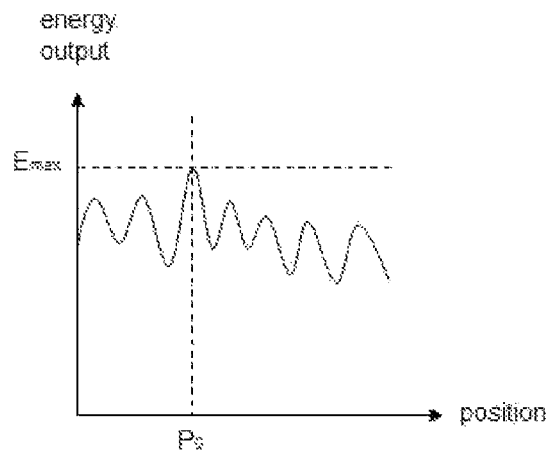
FIG. 5 is a graph illustrating variations in real-time power generation amounts of the bifacial solar modules of FIG. 1 according to a position of a mobile cart.

FIG. 5 is a graph illustrating variations in real-time power generation amounts of the bifacial solar modules 1 and 2 of FIG. 1 according to a position of the mobile car 200.

An incident angle of direct light is seasonally equal. However, an amount and an incident angle of scattered light may vary according to environmental factors such as clouds, fine dust, other objects, and the like.

The control portion C is connected to the inverter wirelessly or through wires and monitors operating conditions (real-time power generation amount) of the bifacial photovoltaic system 1000 in real time. The controller 230 receives a signal from the control portion C and controls the driving portion 250.

The control portion C transmits a signal to the controller 230 at a position PO where real-time power generation amounts of the first bifacial solar module 1 and the second bifacial solar module 2 become maximized (Emax) so as to stop the mobile cart 200.

Accordingly, the bifacial photovoltaic system 1000 according to one embodiment of the present invention may maximize power generation amounts of the first bifacial solar module 1 and the second bifacial solar module 2 in consideration of not only direct light but also scattered light of sunrays.

Figure 6:
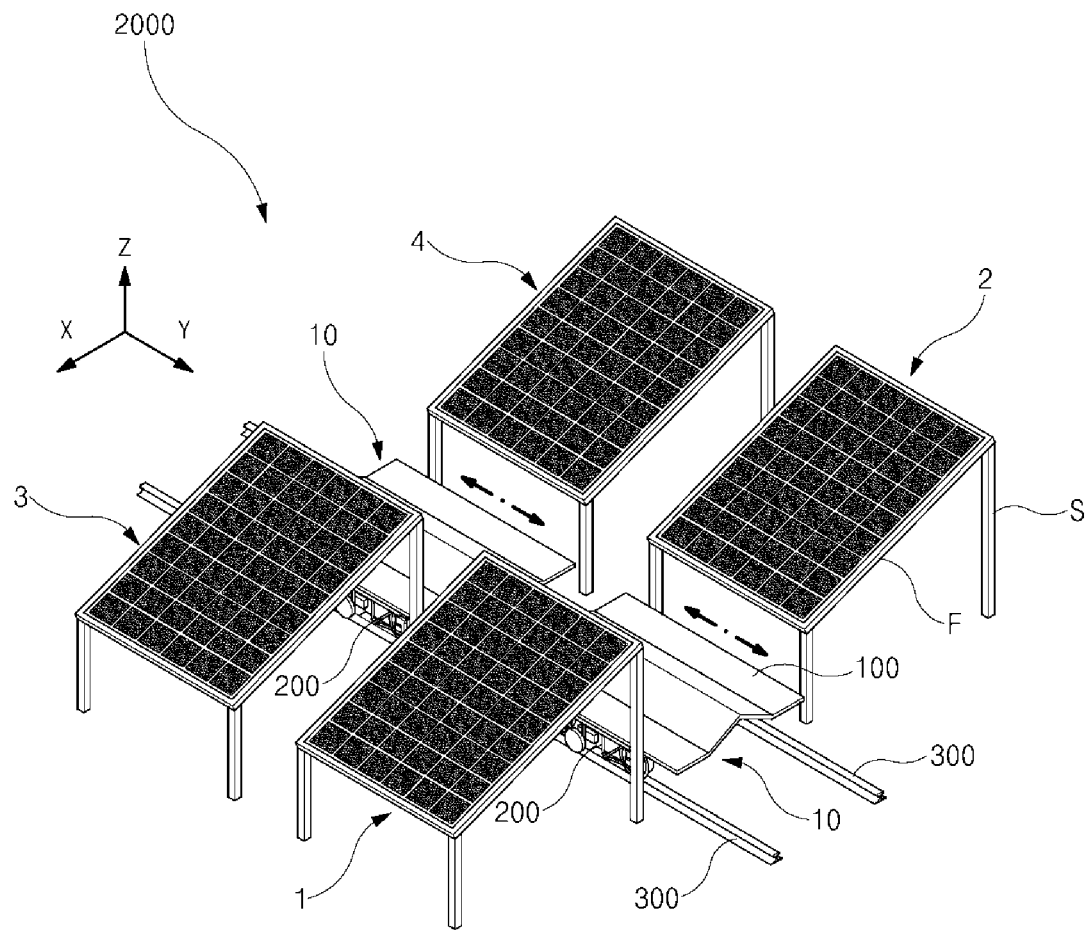
FIG. 6 is a perspective view of a bifacial photovoltaic system according to another embodiment of the present invention.

FIG. 6 is a perspective view of a bifacial photovoltaic system 2000 according to another embodiment of the present invention.

As shown in FIG. 6, the rails 300, along which the wheels 220 of the mobile cart 200 roll, may be provided lengthwise in a direction perpendicular to a direction in which the first bifacial solar module 1 and the second bifacial solar module 2 are spaced apart from each other.

The rails 300 are formed lengthwise in the direction perpendicular to the direction in which the first bifacial solar module 1 and the second bifacial solar module 2 are spaced apart from each other, that is, in a longitudinal direction of the Y-axis. When the torque of the driving portion 250 is applied to the axle of the front wheels 221 or the rear wheels 222, the mobile cart 200 moves along the rails 300 in the longitudinal direction of the Y-axis.

The elevation angle of the sun changes seasonally due to the revolution of the earth and changes regularly at 24-hour intervals due to the rotation of the earth.

The control portion C may control a position of the mobile cart 200 according to variations of the elevation angle of the sun which are caused by the rotation of the earth so as to maximize the power generation amounts of the first bifacial solar module 1 and the second bifacial solar module 2.

The control portion C may prestore position values of the mobile cart 200 at which the power generation amounts of the first bifacial solar module 1 and the second bifacial solar module 2 are maximized according to the variations of the elevation angle of the sun which are caused by the rotation of the earth. Referring to FIG. 5, the control portion C is connected to the inverter wirelessly or through wires and monitors operating conditions (real-time power generation amount) of the bifacial photovoltaic system 1000 in real time.

The controller 230 receives a signal from the control portion C and controls the driving portion 250. The control portion C transmits a signal to the controller 230 at a position PO where real-time power generation amounts of the first bifacial solar module 1 and the second bifacial solar module 2 become maximized (Emax) so as to stop the mobile cart 200.

Accordingly, the bifacial photovoltaic system 2000 according to another embodiment of the present invention may maximize power generation amounts of the first bifacial solar module 1 and the second bifacial solar module 2 in consideration of variations in the elevation angle of the sun which are caused by the rotation of the earth.

Figure 7:
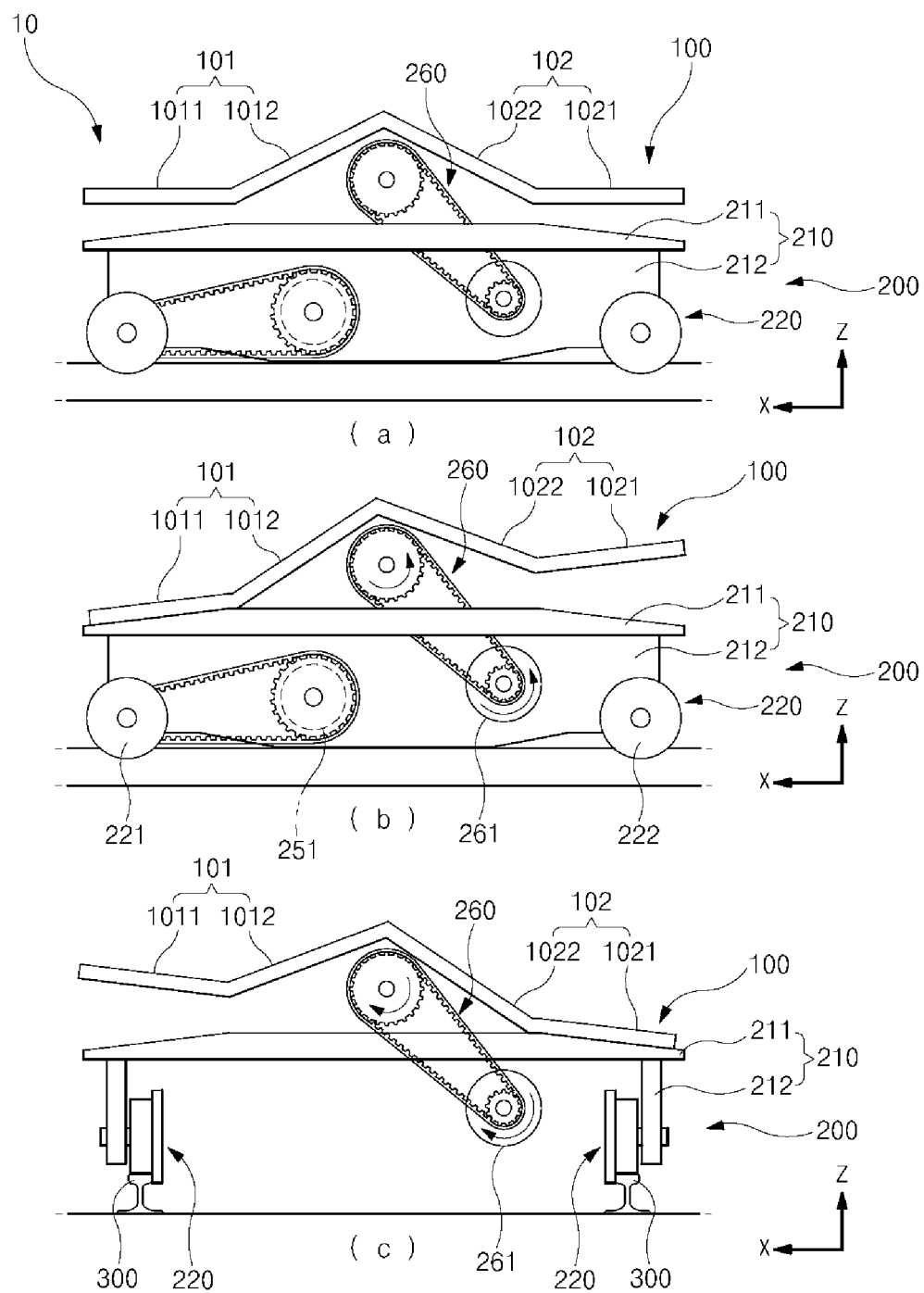
FIG. 7 shows side views (A)-(C) schematically illustrating a reflector of a bifacial solar module according to still another embodiment of the present invention.

FIGS. 7A to 7C are side views schematically illustrating the reflector 10 of a bifacial solar module according to still another embodiment of the present invention. As shown in FIGS. 7A to 7C, the reflecting panel 100 may be rotatably coupled to the mobile cart 200. A protruding portion (not shown) is formed on the upper panel 211, and the reflecting panel 100 may be rotatably coupled to the protruding portion. The mobile cart 200 may include an angle adjustment module 260 configured to rotate the reflecting panel 100 according to a signal of the controller 230.

The angle adjustment module 260 transmits torque of a motor 261 to a rotating shaft of the reflecting panel 100 through gear drive, chain drive, or belt transmission. As an example, the angle adjustment module 260 may implement belt transmission including a pulley and a belt. Since gear drive, chain drive, or belt transmission is a well-known technology, a detailed description thereof will be omitted.

FIGS. 7A and 7B illustrate the angle adjustment module 260 while the rails 300 are provided lengthwise in a direction in which the first bifacial solar module 1 and the second bifacial solar module 2 are spaced apart from each other. As shown in FIG. 1, when the rails 300 are provided lengthwise in the direction in which the first bifacial solar module 1 and the second bifacial solar module 2 are spaced apart from each other, it is not possible to control the position of the mobile cart 200 in the longitudinal direction of the Y-axis according to the variations in the elevation angle of the sun which are caused by the rotation of the earth to maximize the power generation amounts of the first bifacial solar module 1 and the second bifacial solar module 2.

Referring to FIG. 5, the control portion C is connected to the inverter wirelessly or through wires and monitors operating conditions (real-time power generation amount) of the bifacial photovoltaic system 1000 in real time. The controller 230 receives a signal from the control portion C and controls the angle adjustment module 260. The control portion C transmits a signal to the controller 230 at a position PO where real-time power generation amounts of the first bifacial solar module 1 and the second bifacial solar module 2 become maximized (Emax) so as to stop rotation of the reflecting panel 100.

Accordingly, although the rails 300, along which the wheels 220 of the mobile cart 200 roll, are provided lengthwise in the direction in which the first bifacial solar module 1 and the second bifacial solar module 2 are spaced apart from each other, the power generation amounts of the first bifacial solar module 1 and the second bifacial solar module 2 may be maximized in consideration of variations in the elevation angle of the sun which are caused by the rotation of the earth.

FIG. 7C illustrates the angle adjustment module 260 while the rails 300 are provided lengthwise in a direction perpendicular to the direction in which the first bifacial solar module 1 and the second bifacial solar module 2 are spaced apart from each other.

As shown in FIG. 6, when the rails 300 are provided lengthwise in the direction perpendicular to the direction in which the first bifacial solar module 1 and the second bifacial solar module 2 are spaced apart from each other, it is not possible to control the position of the mobile cart 200 according to the variations in the elevation angle of the sun which are caused by the revolution of the earth to maximize the power generation amounts of the first bifacial solar module 1 and the second bifacial solar module 2.

Referring to FIG. 5, the control portion C is connected to the inverter wirelessly or through wires and monitors operating conditions (real-time power generation amount) of the bifacial photovoltaic system 1000 in real time. The controller 230 receives a signal from the control portion C and controls the angle adjustment module 260. The control portion C transmits a signal to the controller 230 at a position PO where real-time power generation amounts of the first bifacial solar module 1 and the second bifacial solar module 2 become maximized (Emax) so as to stop rotation of the reflecting panel 100.

Accordingly, although the rails 300, along which the wheels 220 of the mobile cart 200 roll, are provided lengthwise in the direction perpendicular to the direction in which the first bifacial solar module 1 and the second bifacial solar module 2 are spaced apart from each other, the power generation amounts of the first bifacial solar module 1 and the second bifacial solar module 2 may be maximized in consideration of variations in the elevation angle of the sun which are caused by the revolution of the earth.

According to the present invention, since the control portion C controls the position of the mobile cart 200 between the first bifacial solar module 1 and the second bifacial solar module 2, a position of a reflective surface is automatically adjusted according to the variations of the elevation angle of the sun so as to provide the reflector 10 for the bifacial solar module configured to maximize power generation performance of the bifacial solar modules 1 and 2 and the bifacial photovoltaic system 1000 or 2000 including the same.

Also, since the reflecting panel 100 is rotatably coupled to the mobile cart 200 and since the angle adjustment module 260 rotates the reflecting panel 100 according to a signal of the controller 230, an angle of the reflective surface is automatically adjusted according to the variations of the elevation angle of the sun so as to provide the reflector 10 for the bifacial solar module configured to maximize the power generation amounts of the bifacial solar modules 1 and 2 and the bifacial photovoltaic system 1000 or 2000 including the same.

In addition, since the reflecting panel 100 includes a plurality of reflective surfaces facing different directions, the reflector 10 for the bifacial solar module configured to maximize the power generation amounts of the bifacial solar modules 1 and 2 by reflecting not only direct light but also scattered light toward the back surfaces of the bifacial solar modules 1 and 2 and the bifacial photovoltaic system 1000 or 2000 including the same may be provided.

According to the present invention, since the control portion controls the position of the mobile cart between the first bifacial solar module and the second bifacial solar module, a position of a reflective surface is automatically adjusted according to the variations of an elevation angle of the sun so as to provide a reflector for the bifacial solar module configured to maximize power generation performance of the bifacial solar modules and the bifacial photovoltaic system including the same.

Also, since the reflecting panel is rotatably coupled to the mobile cart and the angle adjustment module rotates the reflecting panel according to a signal of the controller, an angle of the reflective surface is automatically adjusted according to the variations of the elevation angle of the sun so as to provide the reflector for the bifacial solar module configured to maximize the power generation amounts of the bifacial solar modules and the bifacial photovoltaic system including the same.

In addition, since the reflecting panel includes a plurality of reflective surfaces facing different directions, the reflector for the bifacial solar module configured to maximize the power generation amounts of the bifacial solar modules by reflecting not only direct light but also scattered light toward the back surfaces of the bifacial solar modules and the bifacial photovoltaic system including the same may be provided.

Although the particular embodiments of the present invention have been described above and illustrated below, it is apparent to one of ordinary skill in the art that the present invention is not limited to the above embodiments and a variety of changes and modifications may be made without departing from the concept and scope of the present invention. Accordingly, such change and modifications should not be understood as being separate from the technical concept or view of the present invention and it should be noted that the modifications belong to the claims of the present invention.

What is claimed is:

1. A bifacial photovoltaic system comprising:
   a first bifacial solar module spaced apart from the ground and having a front surface facing the sky;
   a second bifacial solar module spaced apart from the ground and having a front surface facing the sky;
   a reflecting panel configured to reflect sunrays toward back surfaces of the first bifacial solar module and the second bifacial solar module;
   a mobile cart configured to support the reflecting panel and be movable below and between the first bifacial solar module and the second bifacial solar module; and
   a control portion configured to control a position of the mobile cart to maximize power generation amounts of the first bifacial solar module and the second bifacial solar module.

2. The bifacial photovoltaic system of claim 1, wherein a position value of the mobile cart according to an elevation angle of the sun is set in the control portion, and wherein the control portion controls a position of the mobile cart according to the elevation angle of the sun.

3. The bifacial photovoltaic system of claim 2, wherein the control portion receives real-time power generation amounts of the first bifacial solar module and the second bifacial solar module, and
   wherein the control portion controls a position of the mobile cart to be a position where the power generation amounts of the first bifacial solar module and the second bifacial solar module are maximized.

4. The bifacial photovoltaic system of claim 1, wherein rails, along which wheels of the mobile cart roll, are provided lengthwise in a direction in which the first bifacial solar module and the second bifacial solar module are spaced apart from each other.

5. The bifacial photovoltaic system of claim 1, wherein rails, along which wheels of the mobile cart roll, are provided lengthwise in a direction perpendicular to a direction in which the first bifacial solar module and the second bifacial solar module are spaced apart from each other.

6. The bifacial photovoltaic system of claim 4, wherein the mobile cart comprises:
   a controller configured to receive a signal from the control portion; and
   a driving portion configured to rotate the wheels according to a signal of the controller.

7. The bifacial photovoltaic system of claim 6, wherein the driving portion comprises a motor rotatable bidirectionally according to the signal of the controller, and
   wherein torque of the motor is transmitted to a rotating shaft of the wheels through gear drive, chain drive, or belt transmission.

8. The bifacial photovoltaic system of claim 5, wherein the mobile cart comprises:
   a controller configured to receive a signal from the control portion; and
   a driving portion configured to rotate the wheels according to a signal of the controller.

9. The bifacial photovoltaic system of claim 8, wherein the driving portion comprises a motor rotatable bidirectionally according to the signal of the controller, and
   wherein torque of the motor is transmitted to a rotating shaft of the wheels through gear drive, chain drive, or belt transmission.

10. The bifacial photovoltaic system of claim 1, wherein the reflecting panel comprises:
    a first reflection portion configured to reflect sunrays toward the first bifacial solar module; and
    a second reflection portion configured to reflect sunrays toward the second bifacial solar module, and
    wherein a reflective surface of the first reflection portion and a reflective surface of the second reflection portion are plane-symmetrical to each other.

11. The bifacial photovoltaic system of claim 10, wherein the reflective surface of the first reflection portion and the reflective surface of the second reflection portion form a curved surface.

12. The bifacial photovoltaic system of claim 10, wherein the first reflection portion comprises:
    a first reflection subportion configured to form a reflective surface facing the sky; and
    a second reflection subportion configured to form a reflective surface forming an obtuse angle with the reflective surface of the first reflection subportion.

13. The bifacial photovoltaic system of claim 12, wherein the second reflection portion comprises:
    a third reflection subportion configured to form a reflective surface facing the sky and configured to be plane-symmetrical to the first reflection subportion; and
    a fourth reflection subportion configured to form a reflective surface forming an obtuse angle with the reflective surface of the third reflection subportion portion and configured to be plane-symmetrical to the second reflection subportion, and
    wherein the reflective surface of the second reflection subportion and the reflective surface of the fourth reflection subportion form a reflex angle.

14. The bifacial photovoltaic system of claim 1, wherein the reflecting panel is rotatably coupled to the mobile cart, and
wherein the mobile cart comprises:
a controller configured to receive a signal from the control portion; and
an angle adjustment module configured to rotate the reflecting panel according to a signal of the control portion.

15. The bifacial photovoltaic system of claim 14, wherein the angle adjustment module comprises a motor rotatable bidirectionally according to the signal of the controller, and
wherein torque of the motor is transmitted to a rotating shaft of the reflecting panel through gear drive, chain drive, or belt transmission.

* * * * *